United States Patent
Chien

(10) Patent No.: US 10,091,869 B1
(45) Date of Patent: Oct. 2, 2018

(54) ELECTRONIC DEVICE

(71) Applicant: AU Optronics Corporation, Hsin-Chu (TW)

(72) Inventor: Yuan-Yu Chien, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/924,716

(22) Filed: Mar. 19, 2018

(30) Foreign Application Priority Data

Dec. 15, 2017 (TW) .............................. 106144112 A

(51) Int. Cl.
| | |
|---|---|
| *H05K 1/02* | (2006.01) |
| *H05K 1/14* | (2006.01) |
| *B32B 7/12* | (2006.01) |
| *B32B 3/08* | (2006.01) |
| *H05K 5/00* | (2006.01) |

(52) U.S. Cl.
CPC ............ *H05K 1/0215* (2013.01); *B32B 3/08* (2013.01); *B32B 7/12* (2013.01); *H05K 1/147* (2013.01); *B32B 2307/202* (2013.01); *H05K 5/0017* (2013.01); *H05K 2201/056* (2013.01)

(58) Field of Classification Search
USPC .................................................. 361/749, 748
See application file for complete search history.

(56) References Cited

U.S. PATENT DOCUMENTS 8,817,458 B2 * 8/2014 Clayton ................. G06F 1/184
361/679.31
2013/0048368 A1 * 2/2013 Malek ................. H04M 1/0274
174/354

FOREIGN PATENT DOCUMENTS

TW 201123995 7/2011

* cited by examiner

*Primary Examiner* — Andargie M Aychillhum
(74) *Attorney, Agent, or Firm* — WPAT, PC

(57) ABSTRACT

An electronic device includes a housing, a circuit board, and a conductive adhesive element tape. The circuit board has a first board surface facing the housing and a second board surface facing opposite the housing. The circuit board has a ground pad on the second board surface. The conductive adhesive element tape includes a first portion, a second portion, and a connection portion. The first portion is disposed between the first board surface and the housing. The first portion has a first adhesive surface and a first non-adhesive surface opposite to the first adhesive surface. The first adhesive surface adheres to the housing. The second portion has a second adhesive surface and a second non-adhesive surface opposite to the second adhesive surface. The second adhesive surface adheres to the ground pad. The connection portion connects the first portion and the second portion.

10 Claims, 2 Drawing Sheets

ELECTRONIC DEVICE

BACKGROUND

Technical Field

The present disclosure relates to an electronic device, and in particular, to a display module with a conductive adhesive element tape.

Related Art

With the development of consumer electronics and communications products, liquid crystal displays (LCD) have been widely used in products such as LCD televisions, laptops, desktop computers, and smartphones.

Usually, a display module may configure a ground circuit by using a conductive component connected to a ground pad of a circuit board. However, a connection between the ground pad and the conductive component may be broken by a traction force produced due to deformation or displacement of other components, consequently affecting a ground effect and reducing the product reliability.

SUMMARY

According to an embodiment of the present disclosure, an electronic device is provided. The electronic device includes a housing, a circuit board, and a conductive adhesive element tape. The circuit board has a first board surface facing the housing and a second board surface facing opposite the housing. The circuit board has a ground pad on the second board surface. The conductive adhesive element tape includes a first portion, a second portion, and a connection portion. The first portion is disposed between the first board surface and the housing. The first portion has a first adhesive surface and a first non-adhesive surface opposite to the first adhesive surface. The first adhesive surface adheres to the housing. The second portion has a second adhesive surface and a second non-adhesive surface opposite to the second adhesive surface. The second adhesive surface adheres to the ground pad. The connection portion connects the first portion and the second portion.

To better understand the foregoing descriptions and other aspects of the present disclosure, embodiments are provided below for detailed descriptions with reference to the accompanying drawings.

DETAILED DESCRIPTION

Figure 1:
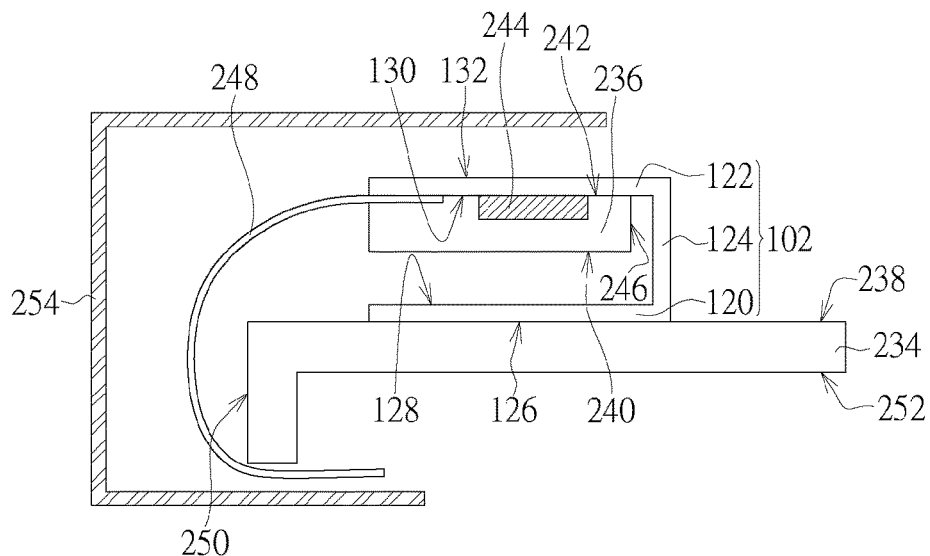
FIG. 1 is a schematic sectional view of an electronic device according to an embodiment.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, "connected" may refer to a physical and/or electrical connection. Furthermore, "electrically connected" or "coupled to" may be other elements between two elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Referring to FIG. 1, FIG. 1 is a schematic sectional view of an electronic device 233 according to an embodiment. The electronic device 233 includes a housing 234, a circuit board 236, and a conductive adhesive element tape 102. The conductive adhesive element tape 102 and the circuit board 236 are disposed on a first housing surface 238 of the housing 234. For example, the electronic device 233 is a display device with a display panel (not shown), and the housing 234 is a back metal or alloy housing (e.g. back iron or iron alloy housing) of the display panel.

The circuit board 236 has a first board surface 240, a second board surface 242 opposite to the first board surface 240, and a ground pad 244 disposed on the second board surface 242. The first board surface 240 faces the housing 234, and the second board surface 242 having the ground pad 244 faces opposite the housing 234, i.e. the second board surface 242 is far away the housing 234 (e.g. the first housing surface 238 of the housing 234).

The conductive adhesive element tape 102 includes a first portion 120, a second portion 122, and a connection portion 124. The connection portion 124 connects the first portion 120 and the second portion 122. By means of the flexibility of the conductive adhesive element tape 102, the first portion 120 of the conductive adhesive element tape 102 may be configured between the first board surface 240 of the circuit board 236 and the first housing surface 238 of the housing 234 and attach to the first housing surface 238 of the housing 234, and the second portion 122 of the conductive adhesive element tape 102 attach to the second board surface 242 having the ground pad 244 after passing by a board side surface 246 of the circuit board 236 by using the connection portion 124 of the conductive adhesive element tape 102.

In this embodiment, the first portion 120 has a first adhesive surface 126 and a first non-adhesive surface 128 opposite to the first adhesive surface 126. The second portion 122 has a second adhesive surface 130 and a second non-adhesive surface 132 opposite to the second adhesive surface 130. The first adhesive surface 126 and the second non-adhesive surface 132 are disposed on a same surface of the conductive adhesive element tape 102. The first non-adhesive surface 128 and the second adhesive surface 130 are disposed on the other surface of the conductive adhesive element tape 102. In other words, the first non-adhesive surface 128 and the second non-adhesive surface 132 are disposed on different surfaces of the conductive adhesive element tape 102.

The first adhesive surface 126 of the first portion 120 of the conductive adhesive element tape 102 adheres to the housing 234 (e.g. the first housing surface 238 of the housing 234). The second adhesive surface 130 of the second portion 122 adheres to the ground pad 244 of the circuit board 236. The housing 234 may be electrically connected to the ground pad 244 by using the conductive adhesive element tape 102.

In this embodiment, the first non-adhesive surface 128 of the first portion 120 of the conductive adhesive element tape 102 is configured to be toward the first board surface 240 of the circuit board 236. The first board surface 240 of the circuit board 236 and the housing 234 may be not adhesive because of the first non-adhesive surface 128, so as to avoid the structure damage caused by a traction force produced by deformation (e.g. warpage of the circuit board 236) or relative displacement of the circuit board 236 and/or the housing 234, and in particular, to avoid the impact on adhesion between the ground pad 244 and the second adhesive surface 130, thereby effectively maintaining an electrical connection between the ground pad 244 and the housing 234. Similarly, the second non-adhesive surface 132 of the second portion 122 of the conductive adhesive element tape 102 may be used to avoid the structure damage caused by a traction force produced by deformation or relative displacement of the circuit board 236 and/or another component above the circuit board 236, and in particular, to avoid the impact on adhesion between the ground pad 244 and the second adhesive surface 130, thereby effectively maintaining the electrical connection between the ground pad 244 and the housing 234. In an embodiment, the first non-adhesive surface 128 is greater or equal to an overlapping area of the first portion 120 and the first board surface 240. In other words, the area of the first non-adhesive surface 128 is not less than the overlapping area of the first portion 120 and the first board surface 240. For example, the first non-adhesive surface 128 may extend to the connection portion 124. The second non-adhesive surface 132 is greater or equal to an overlapping area of the second portion 122 and the second board surface 242. In other words, the area of the second non-adhesive surface 132 is not less than the overlapping area of the second portion 122 and the second board surface 242. For example, the second non-adhesive surface 132 may extend to the connection portion 124. In this embodiment, for example, the first non-adhesive surface 128 and the second non-adhesive surface 132 are formed of an insulating material, and therefore can electrically insulate other components, so as to avoid a short circuit caused by an unexpected electrical connection generated between the conductive adhesive element tape 102 and other conductive components.

The electronic device 233 may further include a flexible circuit board 248 electrically connected to the circuit board 236. The flexible circuit board 248 may be bent from the second board surface 242 of the circuit board 236 to another side. For example, the flexible circuit board 248 is bent across a side of a housing side surface 250 of the housing 234 to a side of a second housing surface 252 opposite to the first housing surface 238. The electronic device 233 may further include a tape member 254. In this embodiment, the tape member 254 adheres to both the housing 234 and the second board surface 242 of the circuit board 236. For example, the tape member 254 may be bent from the second board surface 242 of the circuit board 236 to another side. For example, the tape member 254 is bent across the side of the housing side surface 250 of the housing 234 to the side of the second housing surface 252, so as to fix the circuit board 236 and the housing 234 by means of adhesion. The tape member 254 is not overlapped with the conductive adhesive element tape 102 on the second board surface 242. In this case, the conductive adhesive element tape 102 and the tape member 254 in FIG. 1 are on different tangent planes. A material of the tape member 254 may include a conductive material, which is not limited herein.

Figure 2:
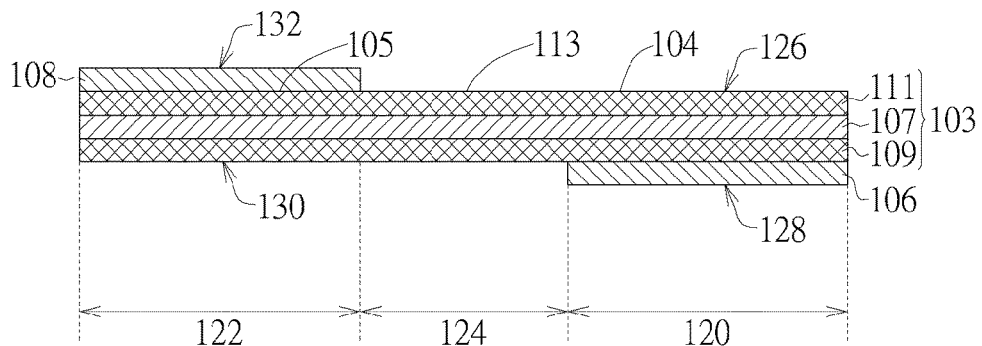
FIG. 2 is a schematic sectional view of a conductive adhesive element tape in a flattened state according to an embodiment.

Referring to FIG. 2, FIG. 2 is a schematic sectional view of a conductive adhesive element tape 102 in a flattened state according to an embodiment. In this embodiment, the conductive adhesive element tape 102 includes a piece of double-sided adhesive tape 103 and a first non-adhesive sheet 106 and a second non-adhesive sheet 108 configured at opposite sides of the double-sided adhesive tape 103. In more detail, for example, the double-sided adhesive tape 103 includes a substrate 107 formed integrally and an adhesive layer 109 and an adhesive layer 111 configured at opposite sides of the substrate 107. In this case, the adhesive layer 109 is conductive. For example, the adhesive layer is doped with conductive particles.

A first portion 120 of the conductive adhesive element tape 102 includes the first non-adhesive sheet 106 and a first double-sided adhesive tape segment 104 of the double-sided adhesive tape 103. The adhesive layer 111 of the first double-sided adhesive tape segment 104 has a first adhesive surface 126. The first non-adhesive sheet 106 is configured on the adhesive layer 109 of the first double-sided adhesive tape segment 104 and has a first non-adhesive surface 128 opposite to the first adhesive surface 126. In this embodiment, a surface of the first non-adhesive sheet 106 has no adhesive layer. In addition, a second portion 122 of the conductive adhesive element tape 102 includes the second non-adhesive sheet 108 and a second double-sided adhesive tape segment 105 of the double-sided adhesive tape 103. The adhesive layer 109 of the second double-sided adhesive tape segment 105 has a second adhesive surface 130. The second non-adhesive sheet 108 is configured on the adhesive layer 111 of the second double-sided adhesive tape segment 105 and has a second non-adhesive surface 132 opposite to the second adhesive surface 130. In this embodiment, a surface of the second non-adhesive sheet 108 has no adhesive layer. In an embodiment, the first non-adhesive sheet 106 and the second non-adhesive sheet 108 are formed of an insulating material, and therefore can electrically insulate other components, so as to avoid a short circuit caused by an unexpected electrical connection generated between the conductive adhesive element tape 102 and other conductive components. For example, the insulating material includes polyethylene terephthalate (PET), but is not limited thereto. Other appropriate insulating materials may alternatively be used. A connection portion of the conductive adhesive element tape 102 includes a third double-sided adhesive tape segment 113 connected between the first double-sided adhesive tape segment 104 and the second double-sided adhesive tape segment 105 of the double-sided adhesive tape 103.

Figure 3:
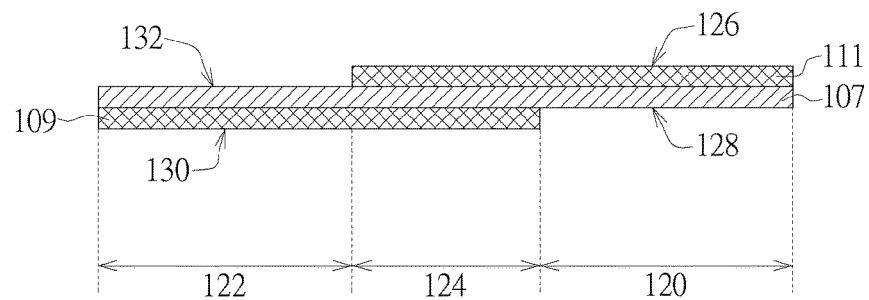
FIG. 3 is a schematic sectional view of a conductive adhesive element tape in a flattened state according to another embodiment.

Referring to FIG. 3, FIG. 3 is a schematic sectional view of a conductive adhesive element tape 102 in a flattened state according to another embodiment. In this embodiment, the conductive adhesive element tape 102 includes a substrate 107 and an adhesive layer 109 and an adhesive layer 111 configured at opposite sides of the substrate 107. In an embodiment, the substrate 107 may be formed integrally. In this embodiment, the substrate 107 may include metal such as aluminum and copper, but is not limited thereto. Other appropriate conductive materials such as a conductive fabric may alternatively be used. In an embodiment, the conductive adhesive element tape 102 shown in FIG. 3 may come into contact only with a ground pad (for example, a ground pad 244 of a circuit board 236), but not with electronic components other than the ground pad.

The adhesive layer 111 of a first portion 120 of the conductive adhesive element tape 102 has a first adhesive surface 126. The substrate 107 of the first portion 120 has a first non-adhesive surface 128 opposite to the first adhesive surface 126. Further, the first non-adhesive surface 128 has no adhesive layer. In addition, the adhesive layer 109 of a second portion 122 of the conductive adhesive element tape 102 has a second adhesive surface 130. The substrate 107 of the second portion 122 has a second non-adhesive surface 132 opposite to the second adhesive surface 130. Further, the second non-adhesive surface 132 has no adhesive layer. A connection portion 124 includes, but not limited to the adhesive layer 109 and the adhesive layer 111 disposed at the opposite sides of the substrate 107 shown in FIG. 3. In other embodiments, for example, the substrate 107 of the connection portion 124 may have an adhesive layer on only one side, or neither of the opposite sides of the substrate 107 have an adhesive layer.

Figure 4:
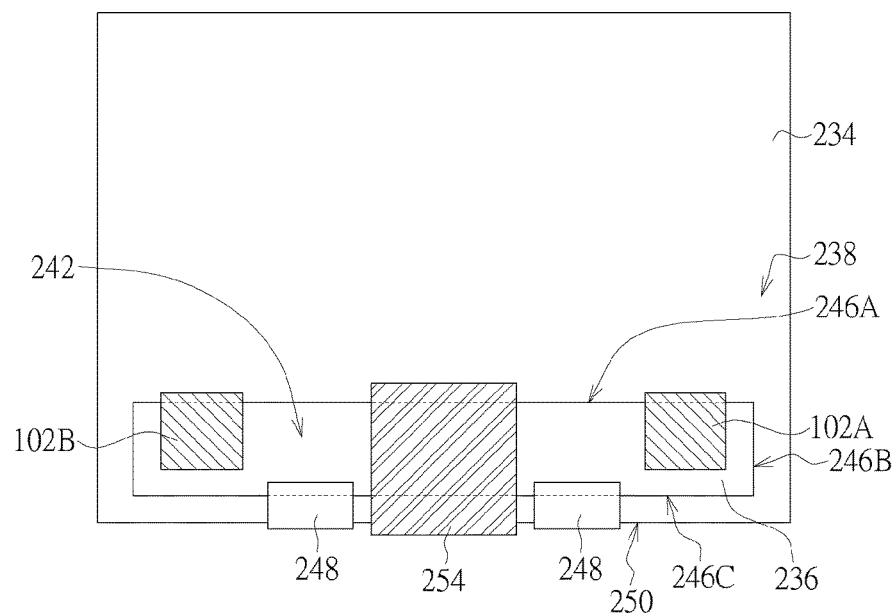
FIG. 4 is a schematic bottom view of an electronic device according to an embodiment.

Referring to FIG. 4, FIG. 4 is a schematic bottom view of an electronic device 233 according to an embodiment. In this embodiment, a ground pad 244 of a circuit board 236 and a conductive adhesive element tape 102A and a conductive adhesive element tape 102B connected to the ground pad 244 are respectively disposed at opposite sides of the circuit board 236. The conductive adhesive element tape 102A, the conductive adhesive element tape 102B and a tape member 254 are not overlapped with each other, for example, not overlapped on a second board surface 242 of the circuit board 236. A flexible circuit board 248 is connected to the circuit board 236 and is bent toward a housing side surface 250 of a housing 234. Using a display module as an example, the flexible circuit board 248 may be connected to, for example, a light source of a backlight module (not shown) or a light emitting or display component in the display module such as a display panel (not shown). In this embodiment, the conductive adhesive element tape 102A is bent from a board side surface 246A to respectively attach to a first housing surface 238 and the second board surface 242. However, in other embodiments, the conductive adhesive element tape 102A may be bent from a board side surface 246B or a board side surface 246C according to actual needs. In other embodiments (not shown), the conductive adhesive element tape 102, 102A, and/or 102B on the second board surface 242 of the circuit board 236 may be overlapped with the tape member 254. A second non-adhesive surface 132 may be formed of an insulting material, so that the tape member 254 and the conductive adhesive element tape 102A and/or 102B are not adhesive and are electrically insulted from each other.

The concept of this disclosure at least has the following advantages according the foregoing embodiments. The first portion of the conductive adhesive element tape disposing between the circuit board and the housing does not adhere to the circuit board because of the first non-adhesive surface and adheres to the housing by using the first adhesive surface at the opposite side, so as to avoid the structure damage caused by a traction force produced by deformation or relative displacement of the circuit board and/or the housing, and in particular, to avoid the impact on adhesion between the conductive adhesive element tape and the ground pad of the circuit board, thereby effectively maintaining an electrical connection between the ground pad and the housing. The second non-adhesive surface of the second portion of the conductive adhesive element tape may be used to avoid the structure damage caused by a traction force produced by deformation or relative displacement of the circuit board and/or another component above the circuit board, and in particular, to avoid the impact on adhesion between the ground pad of the circuit board and the conductive adhesive element tape, thereby effectively maintaining the electrical connection between the ground pad and the housing. The first non-adhesive sheet and/or the second non-adhesive sheet are formed of an insulating material, and therefore can electrically insulate other components, so as to avoid a short circuit caused by an unexpected electrical connection generated between the conductive adhesive element tape and other conductive components.

Based on the above, the present disclosure is disclosed through the foregoing embodiments. However, these embodiments are not intended to limit the present disclosure. Various changes and modifications can be made by persons of ordinary skill in the art without departing from the spirit and scope of the present disclosure. Therefore, the protection scope of the present disclosure is subject to the appended claims.

What is claimed is:
1. An electronic device, comprising:
a housing;
a circuit board, having a first board surface and a second board surface, wherein the first board surface faces the housing, and the circuit board has a ground pad on the second board surface; and
a conductive adhesive element, comprising:
a first portion, disposed between the first board surface and the housing, having a first adhesive surface and a first non-adhesive surface opposite to the first adhesive surface, wherein the first adhesive surface adheres to the housing;
a second portion, having a second adhesive surface and a second non-adhesive surface opposite to the second adhesive surface, wherein the second adhesive surface adheres to the ground pad; and a connection portion, connecting the first portion and the second portion.

2. The electronic device according to claim 1, wherein the first non-adhesive surface has no adhesive layer.

3. The electronic device according to claim 1, wherein the first portion comprises a first double-sided adhesive tape segment and a first non-adhesive sheet, the first non-adhesive sheet attaches to the first double-sided adhesive tape segment, the first double-sided adhesive tape segment has the first adhesive surface, and the first non-adhesive sheet has the first non-adhesive surface.

4. The electronic device according to claim 1, wherein the first non-adhesive surface is greater or equal to an overlapping area of the first portion and the first board surface.

5. The electronic device according to claim 1, wherein the second non-adhesive surface has no adhesive layer.

6. The electronic device according to claim 1, wherein the second portion comprises a second double-sided adhesive tape segment and a second non-adhesive sheet, the second non-adhesive sheet attaches to the second double-sided adhesive tape segment, the second double-sided adhesive tape segment has the second adhesive surface, and the second non-adhesive sheet has the second non-adhesive surface.

7. The electronic device according to claim 1, wherein the second non-adhesive surface is greater or equal to an overlapping area of the second portion and the second board surface.

8. The electronic device according to claim 1, wherein the first portion, the second portion, and the connection portion have a substrate formed integrally, the substrate has two opposite sides in a flattened state, the first portion further comprises a first non-adhesive sheet, the second portion further comprises a second non-adhesive sheet, and the first non-adhesive sheet and the second non-adhesive sheet are respectively disposed at the two opposite sides of the substrate.

9. The electronic device according to claim 1, further comprising a flexible circuit board electrically connected to the circuit board, wherein the flexible circuit board is bent from a first side of the housing to a second side of the housing.

10. The electronic device according to claim 1, further comprising a tape member, wherein the tape member adheres to both the housing and the second board surface of the circuit board, and the tape member is not overlapped with the conductive adhesive element tape on the second board surface.

* * * * *